US010643732B2

(12) United States Patent
Ben-Rubi et al.

(10) Patent No.: US 10,643,732 B2
(45) Date of Patent: May 5, 2020

(54) DETERMINING LINE FUNCTIONALITY ACCORDING TO LINE QUALITY IN NON-VOLATILE STORAGE

(71) Applicant: Western Digital Technologies, Inc., San Jose, CA (US)

(72) Inventors: Refael Ben-Rubi, Rosh Haayin (IL); Moshe Cohen, Modi'in (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 91 days.

(21) Appl. No.: 15/933,209

(22) Filed: Mar. 22, 2018

(65) Prior Publication Data

US 2019/0295677 A1 Sep. 26, 2019

(51) Int. Cl.
G11C 29/38 (2006.01)
G11C 29/50 (2006.01)
G11C 29/36 (2006.01)

(52) U.S. Cl.
CPC .............. *G11C 29/38* (2013.01); *G11C 29/36* (2013.01); *G11C 29/50* (2013.01)

(58) Field of Classification Search
CPC .......... G11C 29/38; G11C 29/36; G11C 29/50
USPC ................ 714/719, 715, 704, 731, 736, 742
See application file for complete search history.

(56) References Cited

U.S. PATENT DOCUMENTS

| | | | |
|---|---|---|---|
| 7,443,757 B2 | 10/2008 | Cernea et al. | |
| 7,671,627 B1* | 3/2010 | Somani | G06F 9/3861 326/46 |
| 7,802,034 B2* | 9/2010 | Liu | G06F 13/385 710/62 |
| 7,849,332 B1* | 12/2010 | Alben | G06F 1/206 713/300 |
| 7,886,164 B1* | 2/2011 | Alben | G06F 1/3203 713/300 |
| 7,971,023 B2* | 6/2011 | Cheng | G06F 11/3419 711/104 |
| 8,103,898 B2 | 1/2012 | Dimitriu et al. | |
| 8,839,051 B1* | 9/2014 | Yeung | G06F 11/10 714/54 |
| 8,935,559 B2 | 1/2015 | Poulton et al. | |
| 9,047,184 B2* | 6/2015 | Bull | G06F 11/0721 |
| 9,053,066 B2 | 6/2015 | Ramachandra et al. | |
| 9,069,688 B2* | 6/2015 | Chung | G06F 11/08 |
| 9,087,025 B2 | 7/2015 | Hollis | |
| 9,170,769 B2* | 10/2015 | Mirchandani | H03K 19/096 |
| 9,354,690 B1* | 5/2016 | Joffe | G06F 1/26 |
| 10,461,804 B2 | 10/2019 | Cohen et al. | |
| 2004/0019844 A1* | 1/2004 | Goodnow | H04L 1/0009 714/798 |

(Continued)

FOREIGN PATENT DOCUMENTS

CN 102915770 A 2/2013

OTHER PUBLICATIONS

Clarke; Memory and Storage; SK Hynix Pushes 16-nm NAND to 128-Gbit; IEEE Acquired Electronics 360; dated Nov. 20, 2013 (2 pages).

*Primary Examiner* — John J Tabone, Jr.
(74) *Attorney, Agent, or Firm* — Patterson + Sheridan, LLP (57) ABSTRACT

An apparatus and method are described to determine line functionality between two electrical circuits to enable the line to run at a maximum frequency without deleterious conditions occurring from cross-talk effects.

25 Claims, 3 Drawing Sheets

(56) References Cited

U.S. PATENT DOCUMENTS

| | | | |
|---|---|---|---|
| 2008/0019031 A1* | 1/2008 | Chu | G11B 5/59616 360/69 |
| 2008/0089433 A1 | 4/2008 | Cho et al. | |
| 2008/0162737 A1* | 7/2008 | Liu | G06F 3/0613 710/8 |
| 2008/0162753 A1* | 7/2008 | Liu | G06F 13/385 710/74 |
| 2008/0215947 A1* | 9/2008 | Hunt | G01R 31/31705 714/745 |
| 2009/0249175 A1* | 10/2009 | Chandra | G06F 11/00 714/822 |
| 2009/0276570 A1* | 11/2009 | Cheng | G06F 11/3419 711/115 |
| 2011/0185262 A1* | 7/2011 | Kershaw | H04B 7/0619 714/776 |
| 2011/0219274 A1* | 9/2011 | Cho | G06F 11/00 714/708 |
| 2011/0283060 A1* | 11/2011 | Ware | G06F 13/1636 711/106 |
| 2012/0093268 A1* | 4/2012 | Elend | H04L 7/048 375/344 |
| 2013/0332784 A1* | 12/2013 | Minotani | G11C 29/08 714/718 |
| 2014/0351359 A1* | 11/2014 | Grocutt | G06F 1/12 709/209 |
| 2015/0186309 A1* | 7/2015 | Lee | G06F 13/1678 710/307 |
| 2015/0333760 A1* | 11/2015 | Zerbe | H03K 3/0315 331/25 |
| 2017/0177056 A1* | 6/2017 | Tumquist | G06F 1/324 |

* cited by examiner

DETERMINING LINE FUNCTIONALITY ACCORDING TO LINE QUALITY IN NON-VOLATILE STORAGE

CROSS-REFERENCE TO RELATED APPLICATIONS

None

FIELD OF THE DISCLOSURE

Aspects of the disclosure relate to computer systems. More specifically, aspects of the disclosure relate to systems and methods to account for cross-talk situations applying to memory arrangements, such as solid state drives.

BACKGROUND INFORMATION

Field

Cross-talk that occurs between different components in a computer system can adversely affect the operation of the computer. Cross-talk, however, is difficult to control for several reasons. Cross-talk occurs when inductive, capacitive or conductive coupling occurs between lines that are in relatively close vicinity to one another. As there is a premium on space placed in electronics, greater numbers of systems are placed within a standard footprint of a computer memory arrangement, such as a solid state drive.

Inductive coupling occurs, for example, when two conductors are placed in close proximity to one another and a change in a current that is placed in one of the conductors (wires) induces a voltage across the ends of the other wire through electromagnetic induction. The amount of coupling between the two conductors (wires) may be measured through a mutual inductance.

Conductive coupling occurs when there is a direct transfer of electrical energy by means of physical contact over a conductive arrangement or medium. Thus, as the size of coupling decreases inside an electrical arrangement, the chances of conductive coupling vastly increase as the tolerances between different conductors decreases. Additionally, the voltages and currents that the conductors perform their respective function can take a major role in whether conductive coupling occurs. As voltages and currents increase, greater distances are needed between conductors to prevent jumping of voltage and current from one conductor to another.

Capacitive coupling occurs when a transfer of energy occurs between two distinct electrical networks. This transfer of energy occurs by means of displacement currents induced by existing electric fields between circuit nodes.

As provided above, the parameters at which a circuit system operates can have a direct impact on if capacitive, inductive or conductive coupling occurs. Typically, when performing different types of computer operations in memory arrangements, increasing the frequency of the operations allows the computer operations to be performed faster. When performing write access operations to a flash memory based system, for example, storage of the data in the flash memory creates a bottleneck situation. It would be desirable, therefore, to increase the frequency of operations to allow the flash memory to operate more freely. Theoretically, the higher the frequency of operations, the better the performance. Frequency of operations can only be increased a limited amount before inductive, capacitive and conductive coupling occurs within the network of systems within the storage arrangement.

Aside from the above limitations, component manufacturers for computer systems have other considerations. Solid state drive manufacturers, for example, need to design their units to be installed in a variety of configurations. As a non-limiting example, a first computer manufacturer may position a solid state drive near an input/output arrangement for a computer mother board. A second computer manufacturer may position a solid state drive near a power supply. A third computer manufacturer may locate a solid state drive near a significant heat source within the computer, thereby affecting the electrical systems that operate within that environment.

Component manufacturers, therefore, are limited with current or conventional technologies in increasing the performance of their respective components without encountering additional concerns from cross-talk.

Different solutions have been tried by manufacturers to limit cross talk in electrical systems. A first solution is to decrease the frequency of operations of the electrical circuits. Such a decrease in operational frequency will decrease the amount of cross talk. The decrease in operational frequency, however, also creates a larger bottleneck for operations, such as NAND flash storage. Such a solution, therefore, is not a desirable overall solution.

A second solution is to increase the space between electrical components, thereby eliminating potential coupling. Solid state drive manufacturers, however, have a limited amount of space upon which they must construct their respective products. These spaces, industrially known as form factors, limit the overall expansion capabilities of the respective components.

There is a need, therefore, to provide an increase in the performance of electrical circuitry, such as solid state drives, without encountering the negative effects of cross-talk.

There is an additional need to provide a cost effective performance enhancement apparatus and method for eliminating cross talk performance limitations.

There is a need to provide a solution to cross-talk effects, wherein the solution may be implemented with standard form factors and space allotments for the systems that are designed.

SUMMARY

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

In one non-limiting embodiment, a method testing an interface between a first electrical circuit and a second electrical circuit is disclosed. The method includes transmitting a data pattern on at least a first line from the first electrical circuit to the second electrical circuit at a transmitting frequency, receiving the data pattern with a received data pattern at the second electrical circuit, increasing a value of a counter by one, comparing the received data pattern at the second electrical circuit to an expected data pattern to obtain a result, decreasing a value of the transmitting frequency to an augmented transmitting frequency when the result is indicates that the data pattern on the first line is different than the received data pattern, increasing a value of the transmitting frequency to an augmented transmitted frequency when the result indicates that the data pattern on the first line is not different than the received data pattern, resending the data pattern on the at least first line from the first electrical circuit to the second electrical circuit at the augmented transmitting frequency, determining if the counter has reached a threshold limit, reporting the augmented transmitted frequency to the first electrical circuit when the counter has reached the threshold limit and reconfiguring the first electrical circuit to send data on the at least the first line at the augmented transmitting frequency.

In another non-limiting embodiment, an arrangement for testing lines between two electrical circuits is disclosed comprising: an application specific integrated circuit configured to send and receive data patterns, an interface module connected to the application specific integrated circuit configured to send and receive data patterns and a flash memory configured with a connection to the interface module, the flash memory having a comparing circuit, wherein the comparing circuit is configured to compare a received data pattern at the flash memory and an expected data pattern.

In another non-limiting embodiment, an arrangement is disclosed having a means for transmitting a data pattern on a line from the first electrical circuit to the second electrical circuit at a transmitting frequency, a means for receiving a received data pattern at the second electrical circuit, a means for comparing the received data pattern to an expected data pattern to obtain a result and a means for decreasing a value of the transmitting frequency to an augmented transmitting frequency when the result is indicates that the data pattern on the first line is different than the received data pattern and increasing a value of the transmitting frequency to an augmented transmitted frequency when the result indicates that the data pattern on the first line is not different than the received data pattern.

In another non-limiting embodiment, a method for testing a line between a first electrical circuit and a second electrical circuit is disclosed comprising transmitting a data pattern on the line at a transmitting frequency, receiving the data pattern with a received data pattern at the second electrical circuit, comparing the received data pattern to an expected data pattern by the second electrical circuit, increasing a loop counter by one, decreasing a value of the transmitting frequency to an augmented transmitting frequency when the data pattern on the first line is different than the received data pattern, increasing a value of the transmitting frequency to an augmented transmitted frequency when the data pattern on the first line is not different than the received data pattern and repeating the transmitting of the data pattern on the line at the augmented transmitted frequency, the receiving of the data pattern, the comparing the received data pattern, the increasing the loop counter, the decreasing the value of the transmitting frequency and the increasing the value of the transmitting frequency until a threshold is reached for the counter.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Some embodiments will now be described with reference to the figures. Like elements in the various figures will be referenced with like numbers for consistency. In the following description, numerous details are set forth to provide an understanding of various embodiments and/or features. It will be understood, however, by those skilled in the art that some embodiments may be practiced without many of these details and that numerous variations or modifications from the described embodiments are possible. As used herein, the terms "above" and "below", "up" and "down", "upper" and "lower", "upwardly" and "downwardly", and other like terms indicating relative positions above or below a given point or element are used in this description to more clearly describe certain embodiments.

Aspects of the present disclosure relate to computer operations and computer storage and specifically, performing automatic performance tuning of storage devices that are connected to a computer host. In the embodiments described, a data storage arrangement is connected to the host system. The function of the data storage arrangement is to accept data and store the data until needed again by a user or the host. The data storage arrangement may be configured to accept bursts of data, depending on the computer process performed, therefore the data storage arrangement is configured with multiple memory units that provide for various states of usage. Certain sections of the data storage arrangement are configured with memory systems that provide for fast action (low latency) so that computer processes may be conducted at a rapid pace. Such low latency performance may be accomplished by single layer cell (SLC) memory configurations. If bulk amounts of data are required to be stored, multiple layer cell memory configurations may also be present, such as triple level cell (TLC) memory configurations. The data storage arrangement may have an interface that allows the data storage arrangement to connect with the host. The interface may be a Serial Attached SCSI (SAS) Interface or Serial ATA (SATA) compatible interface, as a non-limiting embodiments. The memory storage may have a configuration to allow for plug and play ability. Although described as having a SAS or SATA compatible interface, the memory storage device may be provided with a configuration which allows for access by wireless technology. In one non-limiting embodiment, 802.11ac technology may be used to provide for fast performance for smooth streaming. Wireless technology may use, for example, between 2.5 GHz to 5 GHz frequencies for connection. In some embodiments, the storage may allow users to choose the frequencies for wireless connection. While being described as SAS or SATA compatible, other types of interfaces may be used.

Auxiliary connections may be provided to the data storage arrangement to allow for additional options for inputting data directly to the data storage arrangement without interfacing with the host. Such direct input of data may be provided through placement of an integrated secure digital card to offload or copy data. Other auxiliary connections may be provided for additional input/output operations. Such connections may be USB 2.0, USB 3.0, Firewire or other hard wired configurations. Gigabit Ethernet interfaces and connections may also be used.

The data storage arrangement may be configured with a separate power supply or may be run through other power supply means, such as from a computer mother board. In some embodiments, an internal battery may be provided to power the data storage arrangement as an independent entity. Such configurations may be provided such that the data storage arrangement is a portable unit. In such data storage arrangement configurations, the power supply means may be sufficient to power a host and/or charge a host, such as a mobile cellular phone, personal computer, tablet, camera or other configuration. The data storage arrangement may also have a battery indicator to allow a user to understand the amount of charge in the data storage arrangement from a visual inspection. Such battery indicators may be, for example, low energy consumption light emitting diode technology. In specific embodiments, the data storage arrangement may be provided with a circuit to allow for charging and prevent overcharging of the system if the data storage arrangement is connected to an outside power supply for an extended period. In some embodiments, circuitry may be used to determine if a threshold of inactivity has been reached for the storage system, thereby causing the system to enter a low power consumption mode, conserving battery power.

In one non-limiting embodiment, a controller is provided to control actions of the data storage arrangement as required by the host. The controller may also be configured to perform maintenance activities for the data storage arrangement to allow for efficient use.

Internal software may be provided on the data storage arrangement to allow for efficient storage and read capability of data on the system. Such internal software may be used such that the data storage arrangement can be used as a portable media server to wirelessly stream media to a host or output device. Such output devices may include, but not be limited to, smart televisions, smart phones, or stereo audio systems. The internal software may also be provided such that the access of data may be performed by cloud applications designed for interface with the data storage arrangement.

The internal software of the data storage arrangement may also be configured to provide for security of the data storage arrangement. Safeguarding of material provided on the data storage arrangement prevents unauthorized access to sensitive information contained on the system. Such security may be in the form of password protection, such as a Wi-Fi password protection. In some embodiments, the data storage arrangement may be configured with software that allows the data storage arrangement to create a hardware lock. Such hardware locks may prevent access through a USB connection.

The internal software may also be capable of providing diagnostic support for users. In such configurations, two different modes may be provided. A quick test software program may be provided with the capability to check the data storage arrangement for major performance problems. A full test mode may also be provided to provide detailed status information to a user. Such status information may be, for example, the total amount of memory of the data storage arrangement, the amount of memory storage used, storage divisions provided on the data storage arrangement, firmware versions for the internal software, memory block errors and similar data. The internal software may also have the capability of accepting data to update the firmware of the internal software.

The internal software may also be used as a server system wherein in certain embodiments, Digital Living Network Alliance (DLNA) enabled software is incorporated. Such software allows for quick file transfer and error checked operation as a server. In some embodiments, the internal software may be provided with the capability to use file transfer protocol (FTP) to enable the transfer of content to and from the memory storage in public access folders. The data storage arrangement may also provide for either a secured login or an anonymous login capability.

In specific embodiments, the data storage arrangement may be configured such that the system interacts with cloud storage systems. In the event that the data storage arrangement approaches the limits of storage capability, the data storage arrangement may allow for some of the data to be stored on cloud based systems. Selection of the data to be stored on such external storage systems may be governed by the controller which is configured to determine what sections of data may be appropriately stored in cloud based systems to minimize latency for users. The storage system may have a unique identifier MAC address and device name to allow the system to operate on an independent basis. The storage system may also be operated in a configuration that allows for the system to clone a MAC address of a computer that is attached.

The overall capacity of the data storage arrangement may vary according to the different embodiments provided. Capacities 1 TB, 2 TB up to 64 TB may be provided, as non-limiting embodiments. Different form factors may also be provided. In the illustrated embodiment, a form factor of 2.5 inches is provided. Other form factors such as 1.8 inch or 3.5 inch may also be used. Compatibility of the data storage arrangement may be provided for Windows operating systems, Windows Server, Linux and Mac OS, as non-limiting embodiments. Example Windows operating systems that may use the system may be Windows 10, Windows 8 and Windows 7. Example Mac OS systems may be Lion (Mac OSA 10.7), Mountain Lion (Mac OS 10.8), Yosemite (Mac OS 10.10), El Capitan (Mac OS 10.11), Sierra and Mavericks as non-limiting embodiments. Supported browsers for the storage system may be, in non-limiting embodiments, Internet Explorer, Safari, Firefox and Google Chrome.

Software may also be included in the system to allow for quick and automatic backups of data according to user prescribed requirements. Such backup ability may be compliant with Windows based backup and restore functions and/or Apple Time Machine requirements. Furthermore, software may be provided to add more than one user to the storage system. Users can be added or deleted according to an administration account. Such administration account may also allow for restricted access for certain users according to administration requirements.

Aspects presented herein describe techniques for allowing a memory arrangement, such as a solid state drive, to operate at peak efficiency. As provided above, a data storage device may be connected to a computer through a hard wire connection or through a wireless connection. A controller included with the solid state drive may be configured to control functions of the drive and record timestamps associated with events while executing commands. The controller may include circuitry that is configured to record data, in various forms, to allow the drive to alter performance based upon the data recorded. The data that is provided includes details regarding what types of operations are needed to be accomplished, (e.g. write or read commands), how long those commands need to be accomplished, and what types of workloads are necessary to be accomplished.

Figure 1:
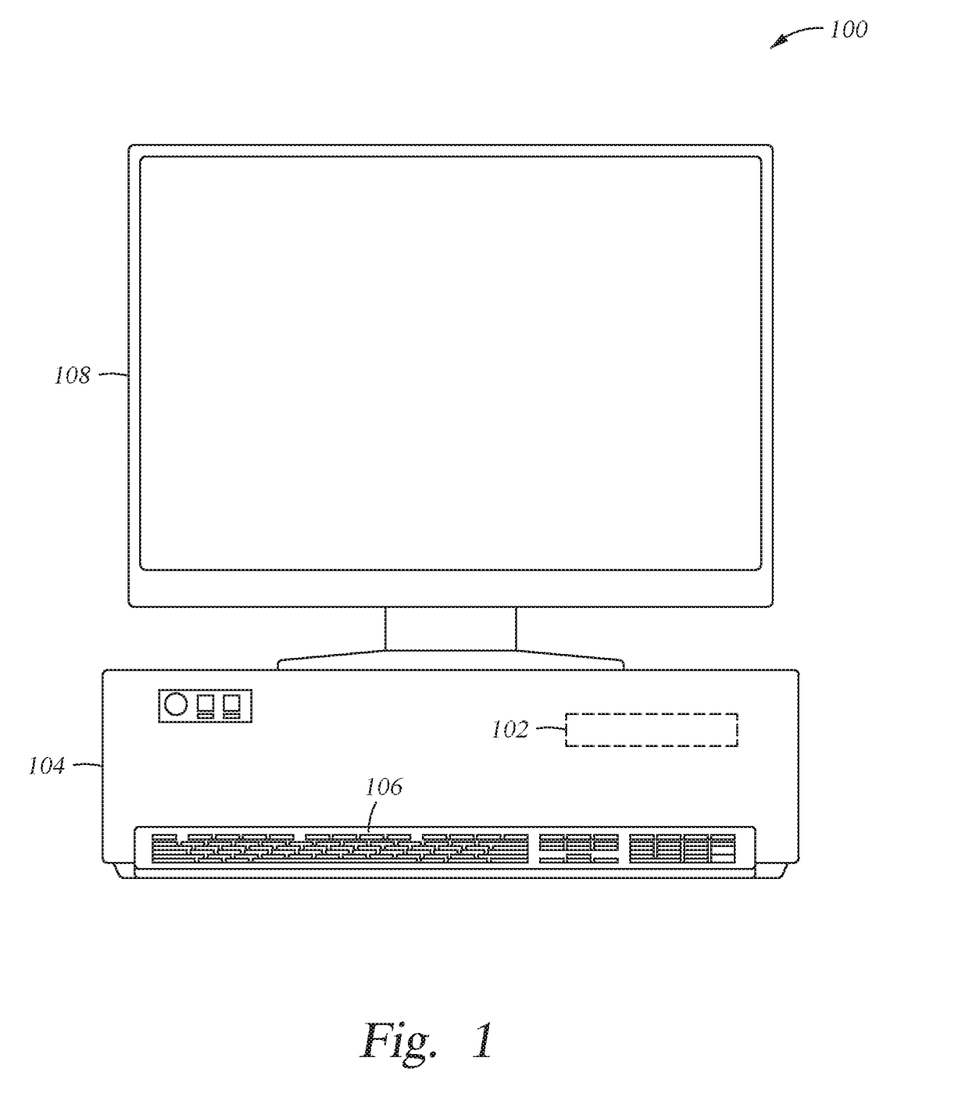
FIG. 1 is a view of a computer system with integrated solid state drive.
Figure 2:
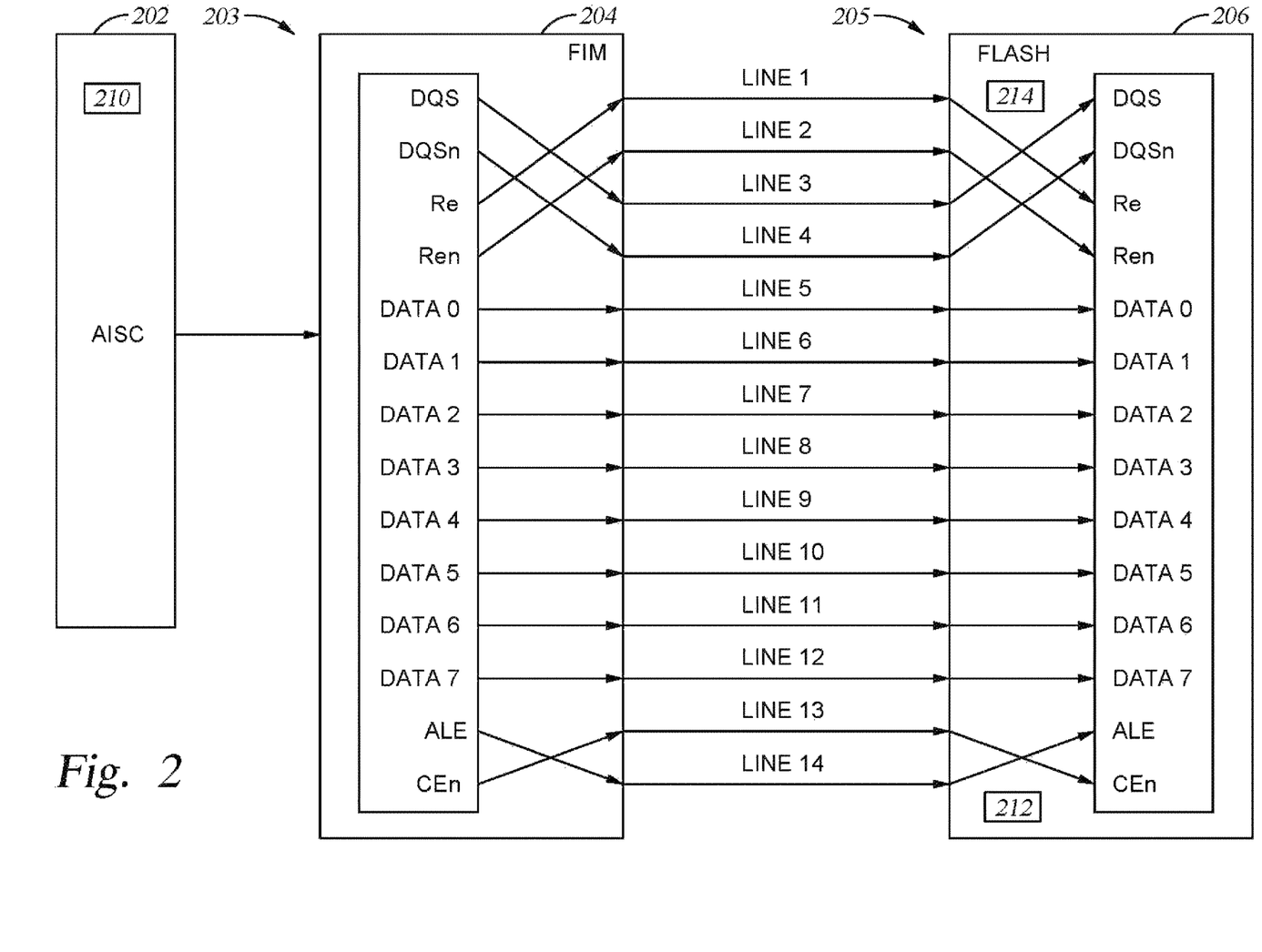
FIG. 2 is a plan view of a flash interface module (FIM) connecting to an application specific integrated circuit (ASIC) and flash module.

Referring to FIG. 1, a host computer 100 is illustrated. The host computer 100 is configured with a memory arrangement 102, such as a solid state drive. The solid state drive 102 is configured to store data that is needed by a user. The use may be immediate or may be years distant, therefore the solid state drive 102 is configured to store the data in a non-volatile manner. Non-volatile storage allows data to be stored within the drive 102 without the drive 102 being connected to a power source. In the illustrated embodiment, the solid state drive 102 may be configured to be removable from the host computer 104. In another embodiment, the solid state drive 102 may be permanently housed within a greater or lesser number of lines 204 may be used and as such, the illustrated embodiment should not be considered limiting. The ASIC 202 comprises a host interface module 210. The flash memory 206 comprises a counter 212, or a loop counter, and a comparing circuit 214.

The application specific integrated circuit 202 is created to send a signal to the flash interface module 204 that will subsequently be transmitted to the flash 206. The signal sent by the ASIC 202 may have a pattern of data provided that may be received by the flash 206. The pattern of data may be, for example, a test sequence of pulses. At the flash 206 the pattern of data received may be different than what was transmitted originally by the ASIC 202. The pattern of data that is received at the flash 206 may also be identical to that sent by the ASIC 202. A processor (not shown), associated with the flash 206, may compare the pattern of data transmitted by the ASIC 202 to an anticipated pattern of data stored in connection with the processor. The pattern data stored within memory connected to the processor is identical to the data originally transmitted by the ASIC 202. The processor allows for identification of alterations of the pattern. The result of the comparison may be used for changes in sending future data, as described below.

TABLE 1

| Pin Name | Needed clock frequency (example numbers only) | Original line connected to this pin | maximum measured clock frequency that can be used in that line | New line connected to this pin | Pins to Lines Routing decision |
|---|---|---|---|---|---|
| ALE | 50 Mhrz | 13 | 45 Mhrz | 14 | Connect ALE, that originally was connected to the line 13, to line 14, since line 14 can support 60 Mhrz which is bigger than 45 Mhrz that line 13 can support. |
| CEn | 40 Mhrz | 14 | 60 Mhrz | 13 | |
| CLE | 50 Mhrz | | 50 Mhrz | | |
| RE | 200 Mhrz | 3 | 230 Mhrz | 1 | RE and REn were originally connected to lines 3, 4 and now connected to lines 1, 2. |
| REn | 200 Mhrz | 4 | 230 Mhrz | 2 | |
| WEn | 50 Mhrz | | 50 Mhrz | | |
| WPn | 10 Mhrz | | 10 Mhrz | | |
| DQS | 220 Mhrz | 1 | 210 Mhrz | 3 | Connect DQS and DQSn (that need 220 Mhrz) to lines 3, 4 that can supply 230 Mhrz, instead of lines 1, 2 that can support only 210 Mhrz clock. |
| DQSn | 220 Mhrz | 2 | 210 Mhrz | 4 | |
| I/O[7:0] | 100 Mhrz | | 100 Mhrz | | |
| R/Bn | 50 Mhrz | | 50 Mhrz | | |
| VSS, VSSQ2, VCC, VCCCQ, VPP, VREF | NA: will always be at same place in interface. | | | | | host computer housing 104. In the solid state drive 102 different types of memory may be used, for example, NAND flash or NOR flash. The host computer 100 may also be configured with an input device 106, such as a keyboard, to allow the user to input data, such as threshold comparison limits, described later, for analysis of data patterns. A monitor 108 may be provided for output of analysis performed by circuitry, such as a second circuit, described later.

Referring to FIG. 2, a plan view of an arrangement 200 that will allow for choosing a line routing according to a line quality. The arrangement 200 is found, for example, in the solid state drive 102 of FIG. 1. The arrangement 200 is provided with an application specific integrated circuit (ASIC) 202, a flash interface module 204 and a flash memory 206. A number of lines 208 extend between the flash interface module 204 and the flash memory 206. The number of lines 208 extending between the flash interface module 204 and the flash memory 206 is fourteen (14). A Referring to FIG. 3, a method 300 for determining a line functionality according to line quality in non-volatile storage is illustrated. In 302, the method starts. At 304, a data pattern is transmitted on at least a first line from the first electrical circuit to the second electrical circuit at a transmitting frequency. The data pattern may be a series of pulses, for example, that repeat. The data pattern may be placed in the ASIC 202 as well as the flash memory 206. As defined, the first electrical circuit 203 may be an electrical arrangement, such as a combination of the ASIC 202 and a flash memory interface module 204, as a non-limiting example. The second electrical circuit 205 may be a flash memory arrangement 206. At 306 the data pattern may be received with a received data pattern at the second electrical circuit 205. As will be understood, the data pattern originally sent from the first circuit 203 may be significantly different than what was received at the second circuit 205 as coupling may have occurred along the line. The data pattern received at the second circuit 205 is therefore defined as a received data pattern. At 308, a counter is increased by a value of one. At 310, the received data pattern is compared in the second electrical circuit 205 to an expected data pattern to obtain a result. The expected data pattern, in the illustrated embodiment, is the original data pattern that may be stored in the second circuit 205. The result obtained from the comparison may be that either the data patterns are the same or that they are different. A user defined threshold may be entered that allows for a specific amount of deviation between the expected data pattern and the received data pattern. The deviations could be several parameters, such as peak voltage, pulse length, pulse frequency, as non-limiting examples. The second electrical circuit 205 may have, for example, a processor or an application specific integrated circuit for conducting the comparing. At 312, a value of the transmitting frequency may be decreased to an augmented transmitting frequency when the result is indicates that the data pattern on the first line is different than the received data pattern. In 312, decreasing the frequency of signals sent through the line will decrease coupling, therefore improving accuracy of communications. Such decreases, however, occur when the data pattern sent by the first circuit 203 does not match the received data pattern. In 314, a value of a value of a transmitting frequency may be changed to an augmented transmitted frequency, a higher frequency of signals than originally sent in 304, when the result indicates that the data pattern on the first line is not different than the received data pattern.

Figure 3:
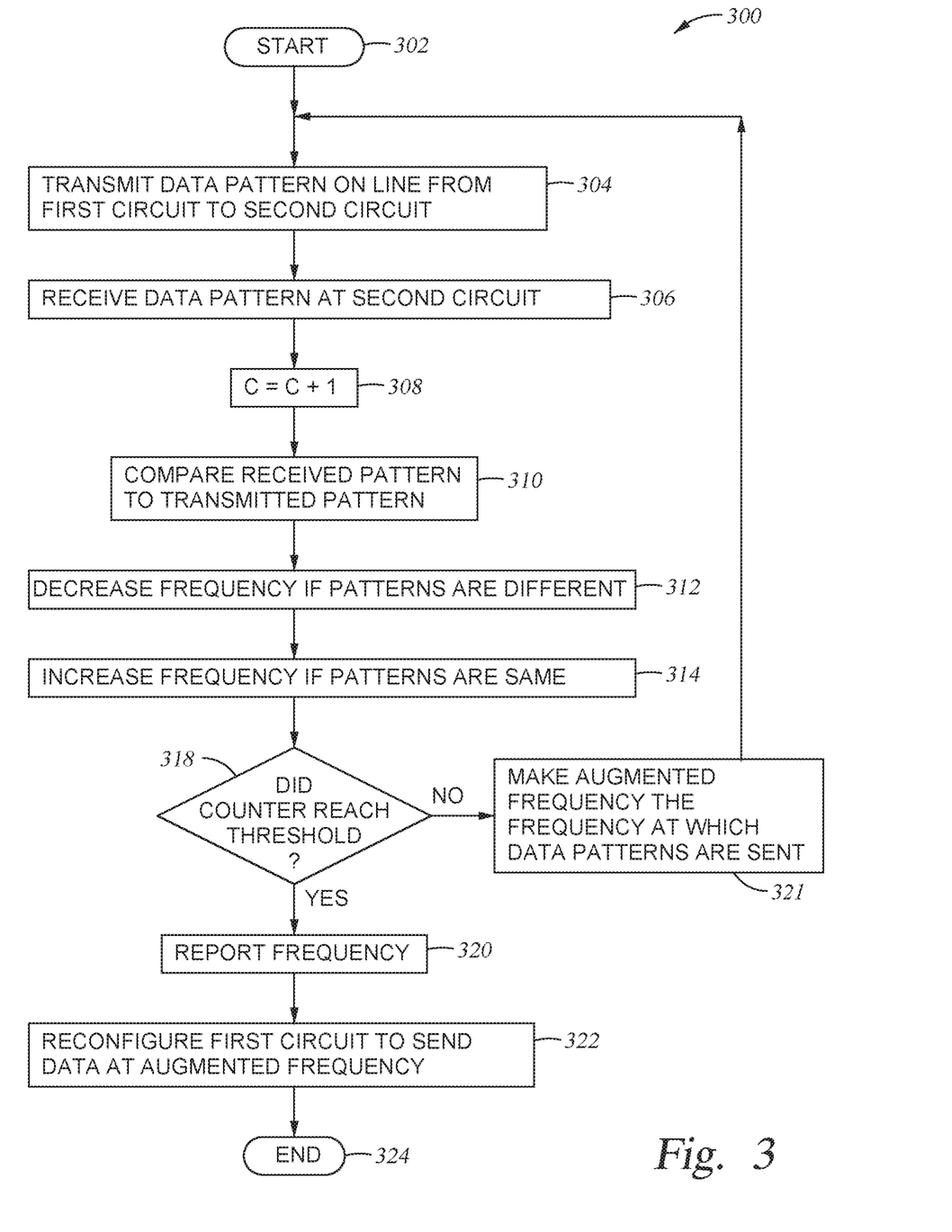
FIG. 3 is flowchart illustrating a method for identifying a maximum supported clock frequency for a line.

At 318, the method processes to determining if the counter has reached a threshold limit. At 320, the method progresses to reporting the augmented transmitted frequency to the first electrical circuit when the counter has reached the threshold limit. At 322, the method then progresses to reconfiguring the first electrical circuit to send data on the at least the first line at the augmented transmitting frequency. The method may stop at 324. At 318, if the counter has not achieved the threshold, then, at 321, the frequency at which the data is used for transmission in 304 is then chosen as the augmented frequency. The method then loops back to 304. The result of the method 300 is that the frequency for which data is sent from the ASIC 202 to the flash interface module 204 to the flash 206 will be a maximum at which data may be sent that will not cause cross-talk errors or disturbance.

In embodiments, the step at which the frequency is decreased or increased may be a predefined equal step amount. In other embodiments, the frequency may be increased or decreased based upon an algorithm that allows convergence of the choice of a frequency in an efficient manner.

Recordation of steps taken to arrive at a maximum frequency may be maintained in a memory to allow a user to identify what the maximum frequencies are for the arrangement. The maximum frequencies for different lines may be different based upon several factors. After determining the line functionality as provided above, the lines may be run at the determined frequencies for a given period. After the given period, the lines may then be retested to again determine the maximum frequencies that may be used for the respective lines. Different causes of degradation in the maximum frequency for lines may be present, such as environmental factors, aging and position of the equipment with respect to other electrical apparatus.

In other alternative embodiments, if the frequency for operations falls below a predetermined amount, a warning may be made to a user that frequency operations are less than optimal, allowing for correction of the condition or replacement of the solid state drive.

In one embodiment, a method for testing an interface between a first electrical circuit and a second electrical circuit is disclosed comprising transmitting a data pattern on at least a first line from the first electrical circuit to the second electrical circuit at a transmitting frequency, receiving the data pattern with a received data pattern at the second electrical circuit, increasing a value of a counter by one, comparing the received data pattern at the second electrical circuit to an expected data pattern to obtain a result, decreasing a value of the transmitting frequency to an augmented transmitting frequency when the result is indicates that the data pattern on the first line is different than the received data pattern, increasing a value of the transmitting frequency to an augmented transmitted frequency when the result indicates that the data pattern on the first line is not different than the received data pattern, resending the data pattern on the at least first line from the first electrical circuit to the second electrical circuit at the augmented transmitting frequency, determining if the counter has reached a threshold limit, reporting the augmented transmitted frequency to the first electrical circuit when the counter has reached the threshold limit and reconfiguring the first electrical circuit to send data on the at least the first line at the augmented transmitting frequency.

In another non-limiting embodiment, the method may be performed wherein the first electrical circuit is at least one of an application specific integrated circuit and a flash interface module.

In another non-limiting embodiment, the method may be performed wherein the second electrical circuit is flash memory.

In another non-limiting embodiment, the method may further comprise reporting the result to the first electrical circuit.

In another non-limiting embodiment, the method may be performed wherein the expected data pattern is identical to the data pattern on the first line.

In another non-limiting embodiment, the method may be performed wherein the threshold limit is ten.

In another non-limiting embodiment, the method may be performed wherein the application specific integrated circuit sends the data pattern to the flash interface module.

In another non-limiting embodiment, the method may be performed wherein the at least the first line is fourteen lines.

In another non-limiting embodiment, the method may be performed wherein the first electrical circuit is a host computer and the second electrical circuit is a host interface module.

In another non-limiting embodiment, the method may be performed wherein the decreasing the value of the transmitting frequency is performed in a standardized step value.

In another non-limiting embodiment, the method may be performed wherein the increasing the value of the transmitting frequency is performed in a standardized step value.

In another non-limiting embodiment, the method may be performed wherein the host computer records the augmented transmitting frequency.

In another non-limiting embodiment an arrangement for testing lines between two electrical circuits is disclosed. The arrangement may comprise an application specific integrated circuit configured to send and receive data patterns, an interface module connected to the application specific integrated circuit configured to send and receive data patterns and a flash memory configured with a connection to the interface module, the flash memory having a comparing circuit, wherein the comparing circuit is configured to compare a received data pattern at the flash memory and an expected data pattern.

In another non-limiting embodiment, the arrangement may be configured wherein the application specific integrated circuit is configured to receive a result from the comparing circuit.

In another non-limiting embodiment, the arrangement may be configured wherein the comparing circuit is configured to calculate a frequency at which a data pattern is configured to be sent by the application specific integrated circuit.

In another non-limiting embodiment, the arrangement may be configured wherein the connection to the interface module comprises at least one line.

In another non-limiting embodiment, the arrangement may be configured wherein the at least one line is fourteen lines.

In another non-limiting embodiment, the arrangement may be configured wherein the interface module is a host interface module.

In another non-limiting embodiment, an arrangement is disclosed. The arrangement comprises a means for transmitting a data pattern on a line from the first electrical circuit to the second electrical circuit at a transmitting frequency, a means for receiving a received data pattern at the second electrical circuit, a means for comparing the received data pattern to an expected data pattern to obtain a result and a means for decreasing a value of the transmitting frequency to an augmented transmitting frequency when the result is indicates that the data pattern on the first line is different than the received data pattern and increasing a value of the transmitting frequency to an augmented transmitted frequency when the result indicates that the data pattern on the first line is not different than the received data pattern.

In another non-limiting embodiment, the arrangement may further comprise a means for counting a number of iterations.

In another non-limiting embodiment, the arrangement may further comprise a means for reporting the augmented transmitted frequency to the first electrical circuit when the counter has reached the threshold limit.

In another non-limiting embodiment, a method for testing a line between a first electrical circuit and a second electrical circuit is disclosed. The method may comprise transmitting a data pattern on the line at a transmitting frequency, receiving the data pattern with a received data pattern at the second electrical circuit, comparing the received data pattern to an expected data pattern by the second electrical circuit, increasing a loop counter by one, decreasing a value of the transmitting frequency to an augmented transmitting frequency when the data pattern on the first line is different than the received data pattern, increasing a value of the transmitting frequency to an augmented transmitted frequency when the data pattern on the first line is not different than the received data pattern and repeating the transmitting of the data pattern on the line at the augmented transmitted frequency, the receiving of the data pattern, the comparing the received data pattern, the increasing the loop counter, the decreasing the value of the transmitting frequency and the increasing the value of the transmitting frequency until a threshold is reached for the counter.

In another non-limiting embodiment, the method may be accomplished wherein the threshold for the counter is ten.

In another non-limiting embodiment, the method according to claim 22, wherein the second electrical circuit is a flash memory circuit.

In another non-limiting embodiment, the method may be accomplished wherein the first electrical circuit is a flash interface module.

In another non-limiting embodiment, the method may be accomplished wherein the decreasing the value of the transmitting frequency is performed in a standardized step value.

In another non-limiting embodiment, the method may be performed wherein the increasing the value of the transmitting frequency is performed in a standardized step value.

A method for testing a transmission of a signal between a first electrical circuit and a second electrical circuit, comprising: transmitting a signal on a line extending between the first electrical circuit and the second electrical circuit at a transmitting frequency; receiving the signal with a received pattern at the second electrical circuit; comparing the received pattern to an expected pattern by the second electrical circuit; increasing a loop counter by one; decreasing a value of the transmitting frequency to an augmented transmitting frequency when the pattern on the line is different than the received pattern; increasing a value of the transmitting frequency to an augmented transmitted frequency when the data pattern on the line is not different than the received pattern and repeating the transmitting of the data pattern on the line at the augmented transmitted frequency, the receiving of the pattern, the comparing the received pattern, the increasing the loop counter, the decreasing the value of the transmitting frequency and the increasing the value of the transmitting frequency until a threshold is reached for the counter.

While embodiments have been described herein, those skilled in the art, having benefit of this disclosure will appreciate that other embodiments are envisioned that do not depart from the inventive scope of the present application. Accordingly, the scope of the present claims or any subsequent related claims shall not be unduly limited by the description of the embodiments described herein.

What is claimed is:

1. A method for testing an interface between a first electrical circuit and a second electrical circuit, comprising:
    transmitting a data pattern on at least a first line from the first electrical circuit to the second electrical circuit at a transmitting frequency;
    receiving the transmitted data pattern as a received data pattern at the second electrical circuit;
    increasing a value of a counter by one, the counter counting a number of times data patterns have been transmitted from the first electrical circuit to the second electrical circuit during the testing;
    comparing the received data pattern at the second electrical circuit to an expected data pattern stored in the second circuit to obtain a result;
    decreasing a first value of the transmitting frequency to an augmented transmitting frequency having a second value different from the first value when the result indicates that the expected data pattern is different than the received data pattern;
    increasing the first value of the transmitting frequency to an augmented transmitted frequency having a third value different from the first value when the result indicates that the expected data pattern on the first lino is not different than the received data pattern;
    determining if the counter has reached a threshold limit;
    setting the augmented frequency having the second value or the third value as the transmitting frequency when the counter has not reached the threshold limit;

reporting the augmented transmitted frequency to the first electrical circuit when the counter has reached the threshold limit to complete the testing of the interface; and reconfiguring the first electrical circuit to send subsequent data on the at least the first line at the augmented transmitting frequency.

2. The method according to claim 1, wherein the first electrical circuit is at least one of an application specific integrated circuit and a flash interface module.

3. The method according to claim 2, wherein the application specific integrated circuit sends the data pattern to a flash interface module.

4. The method according to claim 1, wherein the second electrical circuit is flash memory.

5. The method according to claim 1, further comprising: reporting the result to the first electrical circuit.

6. The method according to claim 1, wherein the expected data pattern is identical to the data pattern on the first line.

7. The method according to claim 1, wherein the threshold limit is ten.

8. The method according to claim 1, wherein the at least the first line is fourteen lines.

9. The method according to claim 1, wherein the first electrical circuit is a host computer and the second electrical circuit is a host interface module.

10. The method according to claim 9, wherein the host computer records the augmented transmitting frequency.

11. The method according to claim 1, wherein the decreasing the value of the transmitting frequency is performed in a standardized step value.

12. The method according to claim 1, wherein the increasing the value of the transmitting frequency is performed in a standardized step value.

13. An arrangement for testing lines between two electrical circuits, comprising:
an application specific integrated circuit configured to send a plurality of data patterns at a transmitting frequency;
an interface module connected to the application specific integrated circuit configured to send the plurality of data patterns at the transmitting frequency;
a flash memory configured with a connection to the interface module, wherein the flash memory is configured to receive a transmitted data pattern as a received data pattern from the application specific integrated circuit, the flash memory having a comparing circuit, wherein the comparing circuit is configured to compare the received data pattern at the flash memory and an expected data pattern stored in the flash memory, and wherein the application specific integrated circuit is configured to adjust the transmitting frequency to an augmented frequency having a different value than the transmitting frequency based on the comparison of the received data pattern to the expected data pattern; and
a counter, wherein the counter counts a number of times the plurality of data patterns have been transmitted from the first electrical circuit to the second electrical circuit during the testing.

14. The arrangement according to claim 13, wherein the application specific integrated circuit is configured to receive a result from the comparing circuit.

15. The arrangement according to claim 13, wherein the comparing circuit is configured to calculate a frequency at which a data pattern is configured to be sent by the application specific integrated circuit.

16. The arrangement according to claim 13, wherein the connection to the interface module comprises at least one line.

17. The arrangement according to claim 16, wherein the at least one line is fourteen lines.

18. The arrangement according to claim 13, wherein the interface module is a host interface module.

19. A method for testing a line between a first electrical circuit and a second electrical circuit, comprising:
transmitting a data pattern on the line at a transmitting frequency;
receiving the transmitted data pattern as a received data pattern at the second electrical circuit;
comparing the received data pattern to an expected data pattern by the second electrical circuit, the expected data pattern being stored in the second circuit;
increasing a loop counter by one, the loop counter counting a number of times data patterns have been transmitted from the first electrical circuit to the second electrical circuit during the testing;
decreasing a first value of the transmitting frequency to an augmented transmitting frequency having a second value different than the first value when the expected data pattern is different than the received data pattern;
increasing the first value of the transmitting frequency to an augmented transmitted frequency having a third value different than the first value when the expected data pattern is not different than the received data pattern;
determining if the counter has reached a threshold limit;
setting the augmented frequency having the second value or the third value as the transmitting frequency when the counter has not reached the threshold limit; and
repeating the transmitting of the data pattern on the line at the augmented frequency having the second value or the third value, the receiving of the transmitted data pattern, the comparing of the received data pattern, the increasing the loop counter, the decreasing the value of the transmitting frequency when the expected data pattern is different than the received data pattern, and the increasing the value of the transmitting frequency when the expected data pattern is not different than the received data pattern until the threshold limit is reached for the loop counter.

20. The method according to claim 19, wherein the threshold for the loop counter is 10.

21. The method according to claim 19, wherein the second electrical circuit is a flash memory circuit.

22. The method according to claim 19, wherein the first electrical circuit is a flash interface module.

23. The method according to claim 19, wherein the decreasing the value of the transmitting frequency is performed in a standardized step value.

24. The method according to claim 19, wherein the increasing the value of the transmitting frequency is performed in a standardized step value.

25. A method for testing a transmission of a signal between a first electrical circuit and a second electrical circuit, comprising:
transmitting the signal on a line extending between the first electrical circuit and the second electrical circuit at a transmitting frequency;
receiving the transmitted signal as a received pattern at the second electrical circuit;
comparing the received pattern to an expected pattern by the second electrical circuit, the expected pattern being stored in the second electrical circuit;

increasing a loop counter by one, the loop counter counting a number of times signals have been transmitted from the first electrical circuit to the second electrical circuit during the testing;

decreasing a first value of the transmitting frequency to an augmented transmitting frequency having a second value different than the first value when the expected pattern is different than the received pattern;

increasing the first value of the transmitting frequency to an augmented transmitted frequency having a third value different than the first value when the expected pattern is not different than the received pattern;

setting the augmented frequency having the second value or the third value as the transmitting frequency when the counter has not reached a threshold limit; and repeating the transmitting of the signal on the line at the augmented frequency having the second value or the third value, the receiving of the signal with a second received pattern, the comparing the second received pattern, the increasing the loop counter, the decreasing the value of the transmitting frequency when the expected data pattern is different than the received data pattern, and the increasing the value of the transmitting frequency when the expected data pattern is not different than the received data pattern until the threshold limit is reached for the loop counter.

* * * * *